United States Patent [19]

Watanabe

[11] Patent Number: 5,250,833
[45] Date of Patent: Oct. 5, 1993

[54] POWER TRANSISTOR FREE FROM BACK GATE BIAS EFFECT AND AN INTEGRATED CIRCUIT DEVICE USING THE SAME

[75] Inventor: Toshio Watanabe, Tokyo, Japan

[73] Assignee: NEC Corporation, Tokyo, Japan

[21] Appl. No.: 7,237

[22] Filed: Jan. 21, 1993

[30] Foreign Application Priority Data

Jan. 21, 1992 [JP] Japan ............................ 4-008762

[51] Int. Cl.[5] ............... H01L 29/10; H01L 27/02; H01L 29/06; H01L 29/78
[52] U.S. Cl. .................... 257/335; 257/346; 257/369; 257/393
[58] Field of Search ............... 257/335, 337, 346, 368, 257/369, 392, 393, 401

Primary Examiner—Mark V. Prenty

[57] ABSTRACT

A power transistor incorporated in an integrated circuit is fabricated on a lightly doped n-type well defined in a p-type semiconductor substrate, and comprises a lightly doped p-type region partially serving as a channel region, an heavily doped drain region formed in the lightly doped p-type region and contiguous to the channel region, and a source region formed in the lightly doped n-type well and spaced apart from the p-type region, a gate insulating film formed on the channel region, a gate electrode on the gate insulating film, and a heavily doped p-type ohmic contact region formed in the lightly doped p-type region for applying positive voltage to the lightly doped p-type region so that the power transistor is constructed as a double diffused MIS type field effect transistor, thereby controlling the back gate independent from the p-type semiconductor substrate.

5 Claims, 4 Drawing Sheets

POWER TRANSISTOR FREE FROM BACK GATE BIAS EFFECT AND AN INTEGRATED CIRCUIT DEVICE USING THE SAME

FIELD OF THE INVENTION

This invention relates to a power transistor and, more particularly, to a power transistor free from back gate bias effect and appropriate for scaling down.

DESCRIPTION OF THE RELATED ART

Power transistors are incorporated in a prior art integrated circuit, and drive high voltage signals ranging from 30 volts to 120 volts. Such a power transistor is expected to withstand large source-to-drain voltage, and the source and drain regions thereof are usually formed in offset regions lower than impurity concentration that the source and drain regions. If a power transistor is expected to withstand 100 volts, the offset regions thereof are doped at $1\times10^{17}$ cm$^{-3}$, and is 8 microns in a direction of source-to-drain current path of the power transistor. The power transistors are incorporated in various integrated circuits such as, for example, pixel driving circuits of a liquid crystal display system or a plasma display system, and is increasing the application field.

A typical example of the power transistor is illustrated in FIG. 1, and forms a part of an integrated circuit device. The integrated circuit device is fabricated on a p-type semiconductor substrate 1 doped with p-type dopant impurity at $1\times10^{14}$ cm$^{-3}$, and surface portions of the p-type semiconductor substrate 1 is doped with n-type dopant impurity at $1\times10^{19}$ cm$^{-3}$ for serving as source and drain regions 2a, 2b, 2c and 2d. The source and drain regions 2a to 2d are spaced apart from one another, and the drain regions 2b and 2c are formed in lightly doped n-type offset regions 2e and 2f. The source region 2d is also formed in a lightly doped offset region 2g. However, any offset region is not provided for the source region 2a, because the source region 2a is grounded. The p-type semiconductor substrate 1 between the source region 2a and the offset region 2e serves as a channel region 2h of an n-channel enhancement type offset field effect transistor Q1, and the p-type semiconductor substrate 1 between the offset regions 2f and 2g also serves as a channel region 2i of an n-channel enhancement type offset field effect transistor Q2. On the channel regions 2h and 2i are grown thin gate oxide films 3a and 3b of 2000 angstroms which is overlain by patterned gate electrodes 4a and 4b of polysilicon. In the prior art fabrication process, after the patterning stage for the gate electrodes 4a and 4b, the offset regions 2e, 2f and 2g are doped at $1\times10^{17}$ cm$^{-3}$ in a selfaligned manner with the gate electrodes 4a and 4b, and each of the offset regions 2e to 2g extends over 8 microns in the lateral direction of FIG. 1 or a direction of the source-to-drain current path of the offset field effect transistor Q1 or Q2.

An inter-level insulating film 5 covers the entire structure, and appropriate constant holes are formed in the inter-level insulating film 5 for integrating the n-channel enhancement type offset field effect transistors Q1 and Q2.

As will be better seen from FIG. 2, the source regions 2a and 2d are coupled with a ground voltage line GND and a variable power voltage line PW1, and the drain regions 2b and 2c are coupled with an output signal line C. An input signal line A supplies an input voltage signal to the patterned gate electrode 4b of the n-channel enhancement type field effect transistor Q2, and a constant voltage B is applied to the patterned gate electrode 4a of the n-channel enhancement type the p-type semiconductor substrate 1 is grounded through a heavily doped ohmic contact region 2j.

The n-channel enhancement type offset field effect transistor Q1 is turned on in the presence of the constant voltage B, and a current path takes place from the drain regions 2b and 2c through the channel region 2h to the ground voltage line GND. In this situation, if the input voltage signal remains low, the n-channel enhancement type offset field effect transistor Q2 turns off, and the output voltage signal C is delayed to the ground voltage level. However, if the input voltage signal A goes up to high voltage level, the n-channel enhancement type offset field effect transistor Q2 turns on, and the output voltage signal C is regulated to a certain voltage level between the variable power voltage level PW1 and the ground voltage level. Thus, the source region 2d is applied with the source region 2d, however, the source region 2d withstands the variable power voltage level of the order of 100 volts.

Since the power voltage level on the line PW1 is variable, the offset region 2g allows the source region 2d to withstand break-down. However, a problem is encountered in high threshold voltage of the n-channel enhancement type offset field effect transistor Q2. In detail, the p-type semiconductor substrate 1 per se serves as the channel region 2i of the n-channel enhancement type offset field effect transistor Q2, and is coupled through the ohmic contact region 2j with the ground voltage line GND. This means that the n-channel enhancement type offset field effect transistor Q2 is left under the influence of the back gate bias phenomenon, and the ground voltage level lifts the threshold voltage of the n-channel enhancement type offset field effect transistor.

SUMMARY OF THE INVENTION

It is therefore an important object of the present invention to provide a power transistor which is free from the problem inherent in the prior art power transistor.

To accomplish the object, the present invention proposes to fabricate a double diffused MIS type power transistor in a well reversely biased with respect to a semiconductor substrate.

In accordance with one aspect of the present invention, there is provided a power transistor fabricated on a semiconductor substrate of a first conductivity type, comprising: a) a well of a second conductivity type formed in a surface portion of the semiconductor substrate, and reversely biased with respect to the semiconductor substrate the second conductivity type being opposite to the first conductivity type; b) a first impurity region of the first conductivity type formed in a predetermined surface portion of the well, and partially used as a channel region; c) a gate insulating film covering the channel region and another surface portion of the well adjacent to the predetermined surface portion; d) a gate electrode formed on the gate insulating film; e) a source region of the second conductivity type formed in yet another surface portion of the well adjacent to the aforesaid another surface portion, and having a boundary substantially aligned with an edge of the gate electrode; f) a drain region of the second conductivity type formed in a predetermined surface portion of the first impurity region, and having a boundary substantially aligned with the opposite edge of the gate electrode; and g) a second impurity region of the first conductivity type formed in another surface portion of the first impurity region, and supplying a certain bias voltage to the first impurity region for controlling back gate biassing phenomenon in the channel region.

In accordance with another aspect of the present invention, there is provided an integrated circuit device fabricated on a semiconductor substrate of a first conductivity type, comprising: a) an enhancement type offset transistor having a conductive channel of a second conductivity type opposite to the first conductivity type, and comprising a-1) a heavily doped source region of the second conductivity type formed in a first surface portion of the semiconductor substrate, and coupled with a constant voltage source, a-2) a lightly doped offset region of the second conductivity type formed in a second surface portion of the semiconductor substrate spaced apart from the first surface portion, a-3) a heavily doped drain region of the second conductivity type formed in a surface portion of the lightly doped offset region, and spaced apart from a periphery of the heavily doped source region, the heavily doped drain region being coupled with an output node for an output voltage signal, a-4) a gate insulating film covering a channel region between the heavily doped source region and the lightly doped offset region, and a-5) a gate electrode formed on the gate insulating film, and applied with a constant voltage signal, the gate electrode having edges substantially aligned with the periphery of the lightly doped offset region and with a periphery of the heavily doped source region; b) an ohmic contact region formed in a third surface portion of the semiconductor substrate, and coupled with the constant voltage source; and c) an enhancement type switching transistor having a conductive channel of the second conductivity type, and comprising c-1) a lightly doped well of the second conductivity type formed in a fourth surface portion of the semiconductor substrate, and reversely biased with respect to the semiconductor substrate, c-2) a first impurity region of the first conductivity type formed in a predetermined surface portion of the lightly doped well, and partially used as a channel region; c-3) a gate insulating film covering the channel region and another surface portion of the lightly doped well adjacent to the predetermined surface portion; c-4) a gate electrode formed on the gate insulating film of the enhancement type switching transistor, and is applied with an input voltage signal, c-5) a source region of the second conductivity type formed in yet another surface portion of the lightly doped well adjacent to the another surface portion, and having a boundary substantially aligned with an edge of the gate electrode of the enhancement type switching transistor, the heavily doped source region of the enhancement type switching transistor being coupled with a power voltage source, c-6) a heavily doped drain region of the second conductivity type formed in a predetermined surface portion of the first impurity region, and having a boundary substantially aligned with the opposite edge of. the gate electrode, and c-7) a second impurity region of the first conductivity type formed in another surface portion of the first impurity region, and coupling the output node with the first impurity region for controlling back gate biassing phenomenon in the channel region.

BRIEF DESCRIPTION OF THE DRAWINGS

The features and advantages of the power transistor and the integrated circuit according to the present invention will be more clearly understood from the following description taken in conjunction with the accompanying drawings in which.

DESCRIPTION OF THE PREFERRED EMBODIMENTS

First Embodiment

Figure 1:
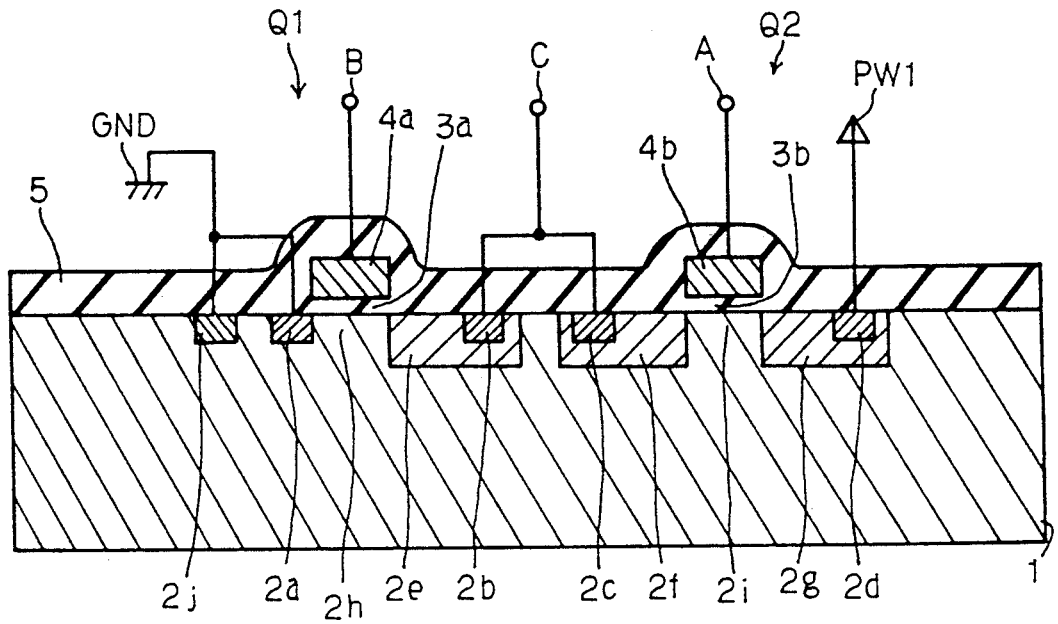
FIG. 1 is a cross sectional view showing the structure of the prior art integrated circuit device partially formed by the power transistors.
Figure 2:
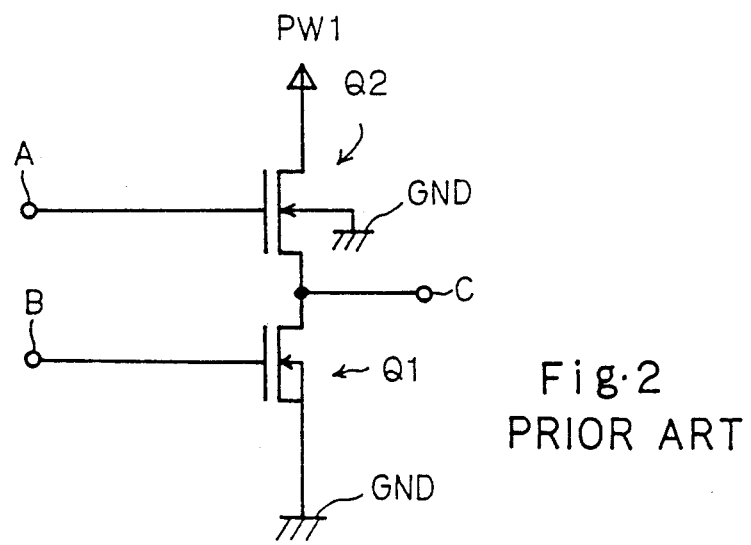
FIG. 2 is an equivalent circuit diagram showing the prior art integrated circuit device.
Figure 3:
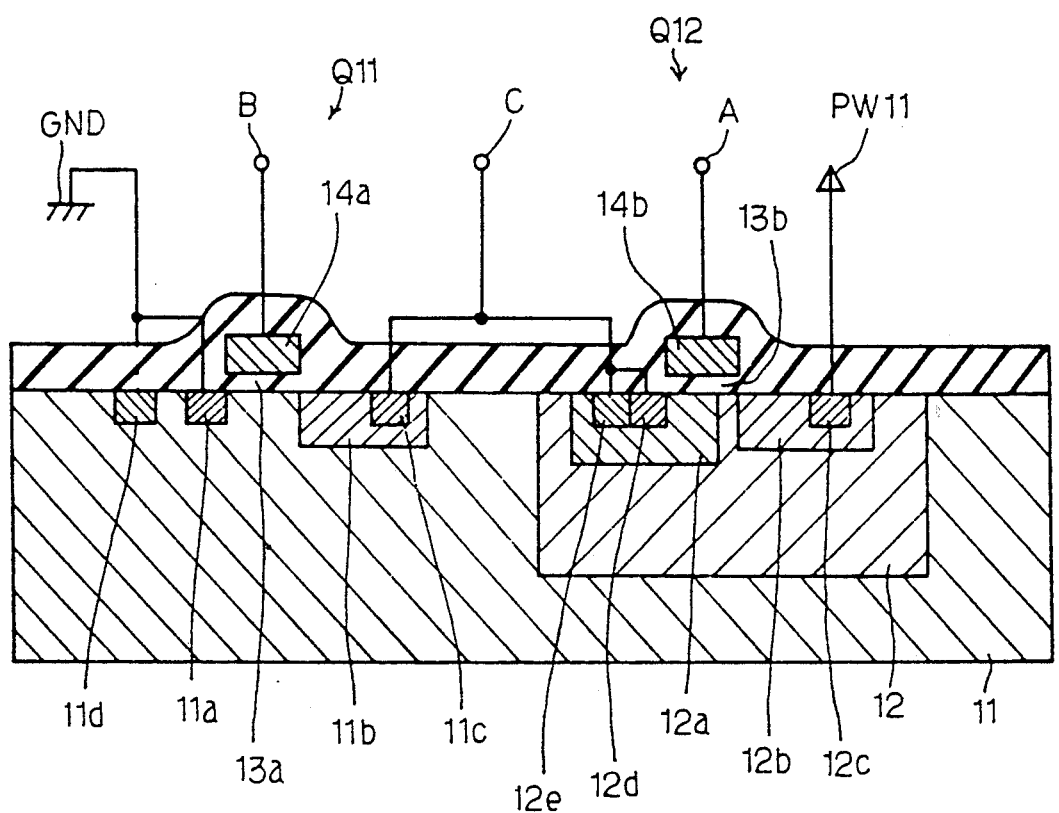
FIG. 3 is a cross sectional view showing the structure of an integrated circuit device according to the present invention.

Referring to FIG. 3 of the drawings, an integrated circuit device embodying the present invention is fabricated on a p-type semiconductor substrate 11 doped with p-type dopant impurity at $6 \times 10^{14}$ cm$^{-3}$, and largely comprises an n-channel enhancement type offset transistor Q11 and an n-channel enhancement type switching transistor Q12. A lightly doped n-type well 12 is defined in a surface portion of the p-type semiconductor substrate 11, and the lightly doped n-type well 12 is doped with n-type dopant impurity at $5 \times 10^{15}$ cm$^{-3}$. The n-type enhancement type offset transistor Q11 and the n-channel enhancement type switching transistor Q12 are fabricated on a surface portion of the p-type semiconductor substrate 11 and the n-type well 12, respectively, and the n-type enhancement type switching transistor Q12 is constructed into a double diffused MIS structure as described hereinbelow.

The n-channel enhancement type offset transistor Q11 comprises a heavily doped n-type source region 11a formed in the p-type semiconductor substrate 11, a lightly doped n-type offset region 11b also formed in the p-type semiconductor substrate 11, a heavily doped n-type drain region 11c formed in the lightly doped n-type offset region 11b, a gate insulating film 13a formed on a channel region between the source region 11a and the offset region 11b, and a gate electrode 14a provided on the gate insulating film 13a. The gate electrode 14a is self-aligned with the heavily doped n-type source region 11a and with the lightly doped n-type offset region 11b.

The source region 11a is doped with n-type dopant impurity at $1 \times 10^{19}$ cm$^{-3}$, and the drain region has dopant concentration at $1 \times 10^{19}$ cm$^{-3}$. However, the offset region 11b is doped at $5 \times 10^{16}$ cm$^{-3}$, and allows the drain region 11c to be spaced apart from the channel region by 7.5, microns. The gate insulating film 13a is of the order of 2000 angstroms thick, and the gate electrode is formed of doped polysilicon. A heavily doped p-type ohmic contact region 11d is formed in the semiconductor substrate 11, and has dopant concentration at $1 \times 10^{19}$ cm$^{-3}$. The p-type ohmic contact region 11d supplies a certain voltage to the semiconductor substrate 11.

On the other hand, the n-channel enhancement type switching transistor Q12 comprises a lightly doped p-type region 12a formed in the n-type well 12, an n-type source region 12b slightly spaced from the lightly doped p-type region 12a, a heavily doped ohmic contact region 12c formed in the source region 12b, a heavily doped n-type drain region 12d formed in the lightly doped p-type region 12a, a heavily doped p-type ohmic contact region 12e also formed in the lightly doped p-type region 12a, a gate insulating film 13b covering a conductive channel area in the lightly doped p-type region 12a, and a gate electrode 14b provided on the gate insulating film 13b.

In this instance, the p-type region 12a, the source region 12b, the ohmic contact region 12c, the drain region 12d and the ohmic contact region 12e are respectively doped at $2 \times 10^{16}$ cm$^{-3}$, $5 \times 10^{16}$ cm$^{-3}$, $1 \times 10^{19}$ cm$^{-3}$, $1 \times 10^{19}$ cm$^{-3}$ and $1 \times 10^{19}$ cm$^{-3}$. The gate insulating film 13b is 2000 angstroms in thickness, and the gate electrode 14b is formed of doped polysilicon. The n-channel enhancement type switching transistor Q12 thus constructed in the double diffused MIS structure is advantageous over the prior art n-channel enhancement type offset transistor Q2 in transistor size, and, accordingly, occupies a small amount of real estate rather than the prior art offset transistor Q2.

Figure 4:
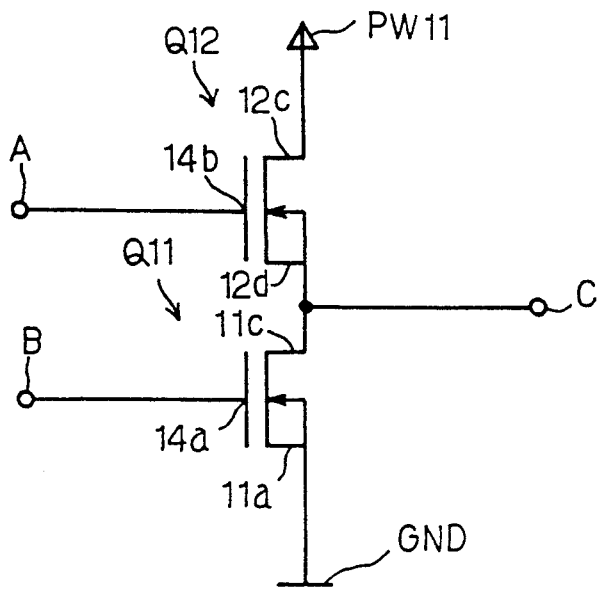
FIG. 4 is an equivalent circuit diagram showing the integrated circuit device shown in FIG. 3.

The n-channel enhancement type offset transistor Q11 and the n-channel enhancement type switching transistor Q12 are integrated as shown in FIG. 4. The source node or the source region 11a is coupled with a ground voltage line GND, and an output node C is coupled with the drain nodes 11c and 12d as well as the ohmic contact region 12e. The source node 12c is coupled with a power voltage line PW11, and variable power voltage on the line PW11 swings its voltage level between 1.0 volts and 80 volts. A constant voltage signal B of 5 volts is applied to the gate electrode of the n-channel enhancement type offset transistor 11c, and the n-channel enhancement type switching transistor Q12 is controlled with an input voltage signal A variable between 0 volts and 80 volts. In other words, the n-channel enhancement type switching transistor Q12 turns on and off depending upon the input voltage signal A, and causes the output node C to change the output signal between 0 volts and 77 volts.

The constant voltage signal B allows the n-channel enhancement type offset transistor Q11 to turn on at all times, and provides predetermined resistance against current flowing into the ground voltage line GND.

As described hereinbefore, the output voltage signal is applied through the ohmic region 12e to the lightly doped p-type region 12a, and the conductive channel takes place in the lightly doped p-type region 12a. This means that the back gate biasing phenomenon at the conductive channel of the switching transistor Q12 is independent from that of the n-channel enhancement type offset transistor Q11, and the positive output voltage signal eliminates the undesirable built-in potential under the back gate biasing phenomenon from the channel area. As a result, the threshold level of the n-channel enhancement type switching transistor Q12 is smaller than that of the prior art offset transistor Q2.

Second Embodiment

Figure 6:
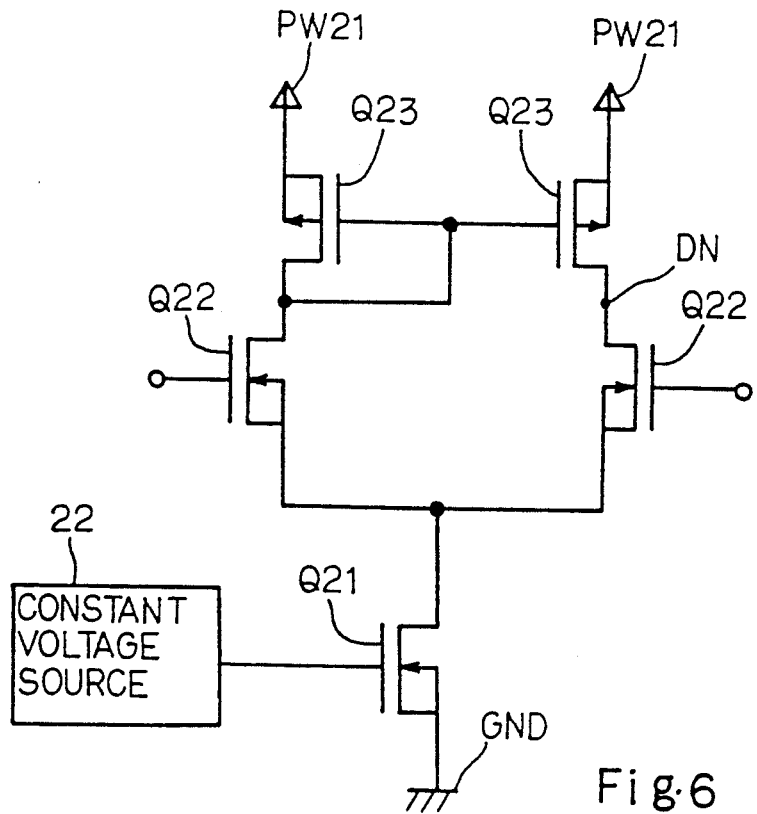
FIG. 6 is an equivalent circuit diagram showing the integrated circuit shown in FIG. 5.
Figure 5:
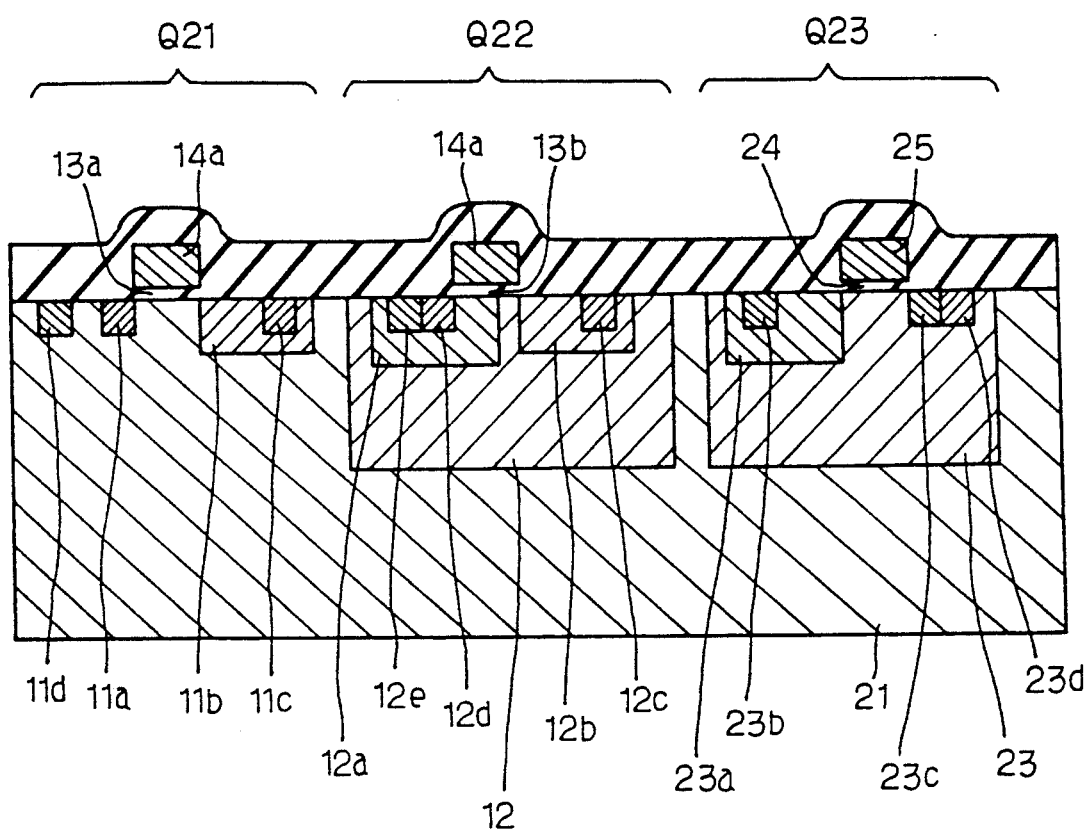
FIG. 5 is a cross sectional view showing the structure of another integrated circuit device according to the present invention.

Turning to FIG. 5 of the drawings, an operational amplifier circuit embodying the present invention is integrated on a p-type semiconductor substrate 21. Although wirings are deleted from FIG. 5, the operational amplifier circuit is arranged in a current mirror configuration as shown in FIG. 6, and comprises two p-channel enhancement type load transistors Q23 coupled with a power voltage line PW21, two n-channel enhancement type amplifier transistors Q22 respectively coupled with the p-channel enhancement type load transistors Q23 and an n-channel enhancement type current source transistor Q21 coupled between the source nodes of the n-channel enhancement type amplifier transistors Q22 and a ground voltage line GND. An input differential voltage signal is applied to the gate electrodes of the n-channel enhancement type amplifier transistors Q22, and a constant voltage source 22 allows the n-channel enhancement type current source transistor Q21 to turn on at all times. An output voltage signal takes place at the common drain node DN of the load transistor Q23 and the amplifier transistor Q22. However, the circuit behavior of the current mirror circuit is well know to those skilled in the art, and no further description is incorporated hereinbelow.

Turning back to FIG. 5, the n-channel enhancement type current source transistor Q21 and the n-channel enhancement type amplifier transistor Q22 respectively correspond to the n-channel enhancement type offset transistor Q11 and the n-channel enhancement type switching transistor Q12, respectively, and regions and films of the transistors Q21 and Q22 are labeled with the same references corresponding to those of the transistors Q11 and Q12 without any detailed description.

Each of the p-channel enhancement type load transistors Q23 is fabricated on an n-type well 23, and comprises a lightly doped p-type offset region 23a, a heavily doped p-type drain region 23b, a heavily doped p-type source region 23c opposed through a channel region to the lightly doped p-type offset region 23a, a heavily doped n-type ohmic contact region 23d coupled with the power voltage line PW21, a gate insulating film 24 over the channel region and a gate electrode 25 on the gate insulating film 24.

Since the n-type well 12 is approximately equal in voltage level to the source node thereof, the n-channel enhancement type amplifier transistor Q22 is free from the back gate biasing phenomenon.

Although particular embodiments of the present invention have been shown and described, it will be obvious to those skilled in the art that various changes and modifications may be made without departing from the spirit and scope of the present invention.

What is claimed is:

1. A power transistor fabricated on a semiconductor substrate of a first conductivity type, comprising:
   a) a well of a second conductivity type formed in a surface portion of said semiconductor substrate, and reversely biased with respect to said semiconductor substrate, said second conductivity type being opposite to said first conductivity type;
   b) a first impurity region of said first conductivity type formed in a predetermined surface portion of said well, and partially used as a channel region;
   c) a gate insulating film covering said channel region and another surface portion of said well adjacent to said predetermined surface portion;
   d) a gate electrode formed on said gate insulating film;
   e) a source region of said second conductivity type formed in yet another surface portion of said well adjacent to said another surface portion, and having a boundary substantially aligned with an edge of said gate electrode;

f) a drain region of said second conductivity type formed in a predetermined surface portion of said first impurity region, and having a boundary substantially aligned with the opposite edge of said gate electrode;

g) a second impurity region of said first conductivity type formed in another surface portion of said first impurity region; and h) means for supplying a certain bias voltage to said second impurity region, said second impurity region transferring said certain bias voltage to said first impurity region for controlling back gate biassing phenomenon in said channel region.

2. A power transistor as set forth in claim 1, in which said drain region is larger in dopant concentration than said first impurity region.

3. An integrated circuit device fabricated on a semiconductor substrate of a first conductivity type, comprising:

a) an enhancement type offset transistor comprising a-1) a heavily doped source region of said second conductivity type formed in a first surface portion of said semiconductor substrate, and coupled with a constant voltage source, a-2) a lightly doped offset region of said second conductivity type formed in a second surface portion of said semiconductor substrate spaced apart from said first surface portion, a-3) a heavily doped drain region of said second conductivity type formed in a surface portion of said lightly doped offset region, and spaced apart from a periphery of said heavily doped source region, said heavily doped drain region being coupled with an output node for an output voltage signal, a-4) a gate insulating film covering a channel region between said heavily doped source region and said lightly doped offset region, and a-5) a gate electrode formed on said gate insulating film and applied with a constant voltage signal, said gate electrode having edges substantially aligned with said periphery of said lightly doped offset region and with a periphery of said heavily doped source region, respectively;

b) an ohmic contact region formed in a third surface portion of said semiconductor substrate, and coupled with said constant voltage source; and c) an enhancement type switching transistor comprising c-1) a lightly doped well of said second conductivity type formed in a fourth surface portion of said semi-conductor substrate, and reversely biased with respect to said semiconductor substrate, c-2) a first impurity region of said first conductivity type formed in a predetermined surface portion of said lightly doped well, and partially used as a channel region, c-3) a gate insulating film covering said channel region and another surface portion of said lightly doped well adjacent to said predetermined surface portion, c-4) a gate electrode formed on said gate insulating film of said enhancement type switching transistor and applied with an input voltage signal, c-5) a source region of said second conductivity type formed in yet another surface portion of said lightly doped well adjacent too said another surface portion, and having a boundary substantially aligned with an edge of said gate electrode of said enhancement type switching transistor, said heavily doped source region of said enhancement type switching transistor being coupled with a power voltage source, c-6) a heavily doped drain region of said second conductivity type formed in a predetermined surface portion of said first impurity region, and having a boundary substantially aligned with the opposite edge of said gate electrode of said enhancement type switching transistor, and c-7) a second impurity region of said first conductivity type formed in another surface portion of said first impurity region, and coupling said output node with said first impurity region for controlling back gate biassing phenomenon in said channel region of said switching transistor.

4. An integrated circuit device as set forth in claim 3, in which said source region of said enhancement type switching transistor comprises a source sub-region defining said boundary, and a heavily doped ohmic sub-region formed in said source sub-region.

5. An integrated circuit device as set forth in claim 3, in which said enhancement type switching transistor serves as a first amplification transistor, the integrated circuit device further comprising:

d) a second amplification transistor similar in structure to said enhancement type switching transistor, and coupled with the node of said drain region node of said enhancement type offset transistor, an input differential voltage signal being applied to gate electrodes of said first and second amplification transistors;

e) first and second offset load transistors respectively coupled between said first and second amplification transistors and said power voltage source, and having respective gate electrodes coupled with a drain node of said first offset load transistor; and f) an output node coupled with a drain node of said second offset load transistor.

* * * * *